US006781157B2

(12) United States Patent
Noguchi et al.

(10) Patent No.: US 6,781,157 B2
(45) Date of Patent: Aug. 24, 2004

(54) LIGHT EMITTING DEVICE AND PROCESS FOR PRODUCING THE SAME

(75) Inventors: Masahiro Noguchi, Tokyo (JP); Eiichi Kunitake, Tokyo (JP); Genta Koizumi, Tokyo (JP)

(73) Assignee: Hitachi Cable, Ltd. (JP)

( * ) Notice: Subject to any disclaimer, the term of this patent is extended or adjusted under 35 U.S.C. 154(b) by 0 days.

(21) Appl. No.: 10/231,294

(22) Filed: Aug. 29, 2002

(65) Prior Publication Data

US 2003/0043254 A1 Mar. 6, 2003

(30) Foreign Application Priority Data

Sep. 5, 2001 (JP) ....................................... 2001-268414

(51) Int. Cl.[7] ................................................ H01L 27/15

(52) U.S. Cl. ............................. 257/79; 257/88; 257/90; 257/91; 257/93; 572/50

(58) Field of Search ............................. 257/88, 90, 91, 257/93; 572/50

(56) References Cited

U.S. PATENT DOCUMENTS 5,666,376 A * 9/1997 Cheng ......................... 372/50
6,236,065 B1 * 5/2001 Kurahashi et al. ............ 257/93

FOREIGN PATENT DOCUMENTS

| | | |
|---|---|---|
| JP | 06-085316 | 3/1994 |
| JP | 07-226535 | 8/1995 |

* cited by examiner

*Primary Examiner*—David Nelms
*Assistant Examiner*—Mai-Huong Tran
(74) *Attorney, Agent, or Firm*—James B. Conte; Barnes & Thornburg

(57) ABSTRACT

A LED monolithic array type like emitting device which has a plurality of light emitting parts. The device is particularly suitable as a light source for printers. Each light emitting part has a light emitting diode having a laminate structure. The laminate structure has an end-type GaAs substrate and, epitaxially grown on the n-type substrate in the following order: 1) an n-type GaSa buffer layer, an n-type laminated reflection film formed of layer pairs, each having AlGaAs layers different from each other in aluminum composition ratio, an n-type AlGaAs lower cladding layer, a p-type or undoped AlGaAs active layer, a p-type AlGaAs upper cladding layer and a p-type AlGaAs contact layer. Each layer pair making up the laminated reflection film has an $Al_{X1}GA_{1-X1}As$ layer and an $Al_{X2}GA_{1-X2}As$ layer where X1 and X2 represent the Al composition ratio.

16 Claims, 2 Drawing Sheets

LIGHT EMITTING DEVICE AND PROCESS FOR PRODUCING THE SAME

BACKGROUND OF THE INVENTION

1. Field of the Invention

The invention relates to a structure of a monolithic array-type light emitting device having a plurality of light emitting parts in one device (chip) and a process for producing the same, and more particularly to a monolithic array-type light emitting device suitable particularly as a light source for printers.

2. Prior Art

Printers of a xerography system utilizing light emitting diodes (LEDs) have been put to practical use.

In this system, LEDs satisfying emission wavelength and emission intensity required based on the light receiving sensitivity of a photoreceptor should be selected. LED arrays using GaAsP as a main material of p/n junction in the light emitting device and LED arrays using GaAlAs as a main material of p/n junction in the light emitting device have been adopted for practical use.

For emission output which is one of important characteristics of LED, in order to provide products having the highest possible emission output, an attempt has been made to efficiently take out light from one direction using the so-called "Bragg-type" multilayered reflection film. The semiconductor multilayered reflection film comprises a plurality of layers of high-refractive index $\lambda/4n$ films and low-refractive index $\lambda/4n$ films wherein $\lambda$ represents emission wavelength of LED and n represents refractive index. In this case, light, which has been emitted from the active layer and directed to the substrate side, is reflected from the multilayered reflection film and exits from the top surface of the device. This can improve the light takeout efficiency.

The provision of the multilayered reflection film, however, poses a new problem of increased resistance of the device. Specifically, in the AlGaAs material used in the multilayered reflection film, the band offset of the valence band at the interface of junction between the high-refractive index film and the low-refractive index film is so large that the injection of holes is not easy, leading to significantly increased resistance of the device. The increased resistance of the device leads to increased forward voltage which adversely affects characteristics of the device and results, for example, in increased power consumption and generation of heat.

Further, in conventional AlGaAs-based LEDs, when AlGaAs materials are adopted in the multilayered reflection film provided between the substrate and the active layer, in terms of the reflectance, it is considered that the light takeout efficiency increases with increasing the refractive index difference and the number of pairs. This had led to a tendency toward the adoption of GaAs in the thin layer on the high-refractive index side while adopting $Al_yGa_{1-y}As$, wherein $0<y\leqq 1$, in the thin layer on the low-refractive index side. The use of GaAs as the high-refractive index film for the purpose of providing higher reflectance, however, further increases the band offset at the interface of each hetero junction constituting the multilayered reflection film, resulting in significantly increased resistance of the device.

The wavelength of the LED array for LED printers is determined by materials used in pn junction in LED. When GaAsP or AlGaAs is used as the material for the pn junction, the wavelength of LED is in many cases 700 to 800 nm. This is because a wavelength region, which provides high emission output, is selected according to materials. On the other hand, in the case of LED printers, the wavelength sensitivity of a photoreceptor, which receives light emitted from LED, is also an important parameter, and the emission wavelength is restricted by a combination of the light emitting device with the photoreceptor. For LED printers, there is an increasing demand for higher speed and higher resolution, and LED arrays with higher output are required. At the present time, however, the above-described materials do not always satisfy the demand at emission efficiencies determined by the materials per se.

Accordingly, high emission output is desired in AlGaAs-based LED arrays for LED printers because the emission output has direct influence on printing speed. To satisfy this requirement, the realization of LED arrays having high output while providing enhanced light takeout efficiency through the adoption of the multilayered reflection film, double hetero (DH) structure or the like is necessary.

SUMMARY OF THE INVENTION

Accordingly, it is an object of the invention to solve the above problems of the prior art and to provide a light emitting device of an LED array which, while utilizing the advantage of improved light takeout efficiency realized by providing a Bragg-type multilayered reflection film, can suppress an increase in resistance of the device attributable to the provision of the multilayered reflection film and, in its turn, an increase in forward voltage, and can realize high emission efficiency and high output on the whole.

The above object can be attained by an LED array-type light emitting device wherein, in an AlGaAs-based LED array device having a Bragg-type multilayered reflection film comprising a plurality of reflection layers, the aluminum (Al) composition ratio of AlGaAs constituting the layers of the multilayered reflection film is specified to make reflection efficiency higher than the case where a high-refractive index GaAs layer is adopted as one reflection layer in the multilayered reflection film, and to suppress an increase in resistance of the device attributable to the provision of the Bragg-type multilayered reflection film and, in its turn, to suppress an increase in forward voltage, thereby realizing high output.

Specifically, according to the first feature of the invention, a monolithic array-type light emitting device comprising a plurality of light emitting parts in one device, wherein: each of said light emitting parts comprises a light emitting diode having a laminate structure comprising an n-type GaAs substrate and, epitaxially grown on the n-type GaAs substrate in the following order, an n-type GaAs buffer layer, an n-type laminated reflection film formed of layer pairs each comprising AlGaAs layers different from each other in Al (aluminum) composition ratio, an n-type AlGaAs lower cladding layer, a p-type or undoped AlGaAs active layer, a p-type AlGaAs upper cladding layer, and a p-type GaAs contact layer; and each of the layer pairs constituting the laminated reflection film is a multilayered film of an $Al_{X1}Ga_{1-X1}As$ layer and an $Al_{X2}Ga_{1-X2}As$ layer where X1 and X2 each represent Al composition ratio, wherein hetero junction has been formed between the $Al_{X1}Ga_{1-X1}As$ layer and the $Al_{X2}Ga_{1-X2}As$ layer, wherein the Al composition ratio is $X1<X2$ and the refractive index is $n1>n2$ where n1 represents the refractive index of the $Al_{X1}Ga_{1-X1}As$ layer and n2 represents the refractive index of the $Al_{X2}Ga_{1-X2}As$ layer, wherein the $Al_{X1}Ga_{1-X1}As$ layer and the $Al_{X2}Ga_{1-X2}As$ layer satisfy $X1\geqq X$ and $X2\geqq X$ where X1 and X2 are as defined above and X represents Al composition ratio in $Al_XGa_{1-X}As$ constituting the active layer, and wherein the $Al_{X1}Ga_{1-X1}As$ layer satisfies $Eg_{X1} \geqq E\lambda$ wherein $Eg_{X1}$ represents the band gap energy of the $Al_{X1}Ga_{1-X1}As$ layer and $E\lambda$ represents emission wavelength energy.

In the light emitting device according to the first feature of the invention, the density of the light emitting parts is preferably not less than 240 dpi (dots per inch).

In any one of the above light emitting devices, preferably, the size of a light emitting region in each LED constituting the light emitting parts is 50×50 μm or less.

In any one of the above light emitting devices, preferably, an electrode contact layer having a size of not more than 10×50 μm is provided on each of the light emitting regions, an ohmic contact part is provided on a part of the top of each of the contact layers, and anodes for respective wirings are drawn respectively from the ohmic contact parts.

In any one of the above light emitting devices, preferably, the anodes for wirings provided in the p-type contact layer are arrayed in a given direction on one side of the light emitting parts perpendicular to the direction of the row of each of the light emitting parts, or alternatively are provided alternately on one side of the light emitting part and on the other side of the light emitting part in a direction perpendicular to the direction of the row of each of the light emitting parts.

In the light emitting device according to the invention, individual light emitting parts are arranged and arrayed in one row or two or more rows.

According to the second feature of the invention, a process for producing a monolithic array-type light emitting device having a plurality of light emitting parts in one device comprises the steps of: forming, by MOVPE, an epitaxial wafer for a light emitting diode having a structure comprising an n-type GaAs substrate and, epitaxially grown on the n-type GaAs substrate in the following order, an n-type GaAs buffer layer, an n-type laminated reflection film formed of layer pairs each comprising AlGaAs layers different from each other in Al (aluminum) composition ratio, an n-type AlGaAs lower cladding layer, a p-type or undoped AlGaAs active layer, a p-type AlGaAs upper cladding layer, and a p-type GaAs contact layer; and forming the plurality of the light emitting parts, wherein each of the layer pairs constituting the laminated reflection film is formed as a multilayered film of an $Al_{X1}Ga_{1-X1}As$ layer and an $Al_{X2}Ga_{1-X2}As$ layer where X1 and X2 each represent Al composition ratio, wherein hetero junction has been formed between the $Al_{X1}Ga_{1-X1}As$ layer and the $Al_{X2}Ga_{1-X2}As$ layer, wherein the Al composition ratio is X1<X2 and the refractive index is n1>n2 where n1 represents the refractive index of the $Al_{X1}Ga_{1-X1}As$ layer and n2 represents the refractive index of the $Al_{X2}Ga_{1-X2}As$ layer, wherein the $Al_{X1}Ga_{1-X1}As$ layer and the $Al_{X2}Ga_{1-X2}As$ layer satisfy $X1 \geqq X$ and $X2 \geqq X$ where X1 and X2 are as defined above and X represents Al composition ratio in $Al_XGa_{1-X}As$ constituting the active layer, and wherein the $Al_{X1}Ga_{1-X1}As$ layer satisfies $Eg_{X1} \geqq E\lambda$ wherein $Eg_{X1}$ represents the band gap energy of the $Al_{X1}Ga_{1-X1}As$ layer and $E\lambda$ represents emission wavelength energy.

In the invention, a distributed Bragg reflection (DBR) film having an AlGaAs multilayered structure is used for effectively taking out light directed to the substrate side.

Here one of the films constituting the Bragg-type laminated reflection film, i.e., a high-refractive index film, is formed of $Al_{X1}Ga_{1-X1}As$ (refractive index n1), while the other film constituting the Bragg-type laminated reflection film, i.e., a low-refractive index film, is formed of $Al_{X2}Ga_{1-X2}As$ (refractive index n2). In this laminated reflection film, the relationship in refractive index n1>n2 is a requirement for increasing the reflection and is necessary for increasing the refractive index difference to enhance the reflectance.

When two reflection layers constituting the semiconductor multilayered film are $Al_{X1}Ga_{1-X1}As$ and $Al_{X2}Ga_{1-X2}As$ (X1<X2), the compositions of the respective layers constituting the multilayered film are selected so that (1) the refractive index difference is increased, (2) the absorption for the object wavelength can be minimized, and (3) an increase in resistance of the device can be minimized. The laminated reflection film may be, for example, n-$Al_{0.25}Ga_{0.75}As/Al_{0.85}Ga_{0.15}As$ laminated reflection film.

A structure satisfying these requirements is advantageous in that the forward voltage at the band offset point is lower than that of the Bragg-type laminated reflection film, in which GaAs has been adopted in one of the layers constituting the laminated reflection film, and that the emission wavelength is less likely to be absorbed in the layers constituting the laminated reflection film, whereby high emission efficiency can be realized.

In the invention, two AlGaAs layers, which are different from each other in aluminum composition ratio, constituting each layer pair in the laminated reflection film (aluminum composition ratio X1<X2, refractive index n1>n2) are constructed so that the two layers satisfy $X1 \geqq X$ and $X2 \geqq X$ where X represents aluminum composition ratio in $Al_XGa_{1-X}As$ constituting the active layer, and the $Al_{X1}Ga_{1-X1}As$ layer satisfies $Eg_{X1} \geqq E\lambda$ wherein $Eg_{X1}$ represents the band gap energy of the $Al_{X1}Ga_{1-X1}As$ layer and $E\lambda$ represents emission wavelength energy. This construction can realize higher reflection efficiency than that the structure wherein a high-refractive GaAs layer is adopted as one of the layers constituting each layer pair in the laminated reflection film.

BRIEF DESCRIPTION OF THE DRAWINGS

The invention will be explained in more detail in conjunction with the appended drawings, wherein.

DESCRIPTION OF THE PREFERRED EMBODIMENTS

Preferred embodiments of the invention will be explained in conjunction with the accompanying drawings.

Figure 1:
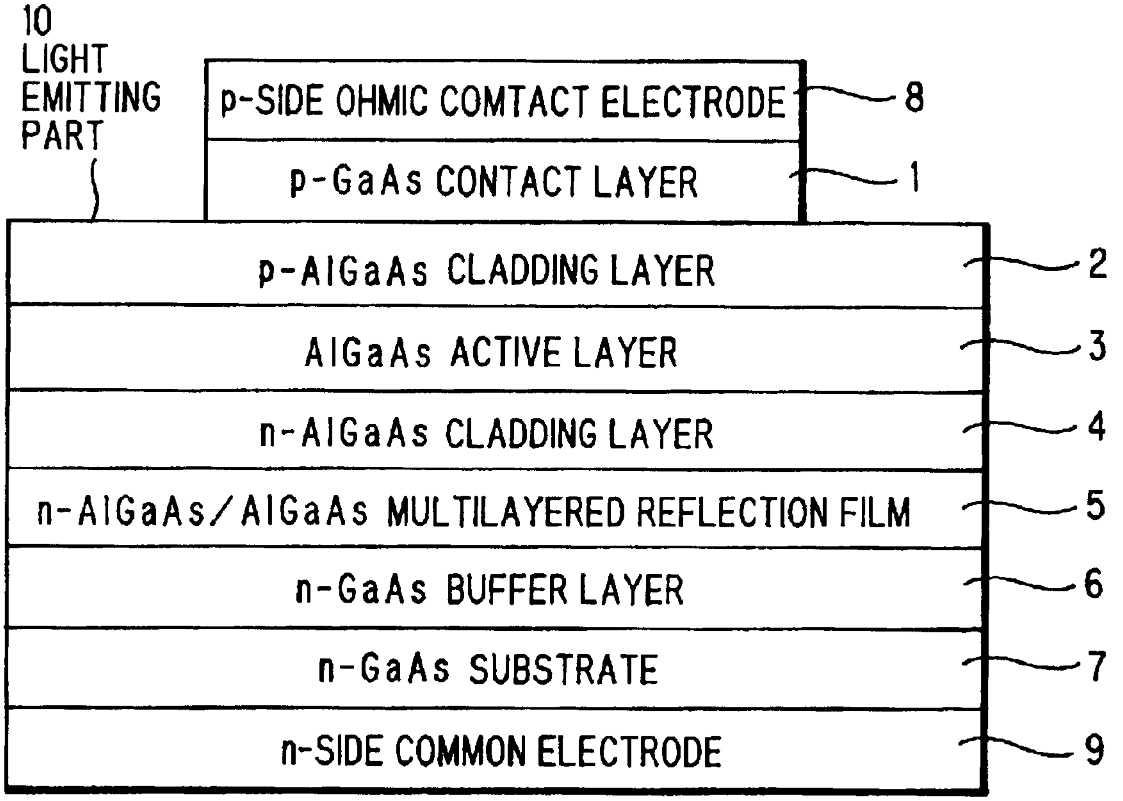
FIG. 1 is a cross-sectional view of one LED part in an LED array constituting a light emitting device in one preferred embodiment of the invention.

FIG. 1 is a cross-sectional view of one LED part in an LED array constituting a monolithic array-type light emitting device in one preferred embodiment of the invention.

In the drawing, an epitaxial wafer for a light emitting diode having a laminate structure comprising an n-type GaAs substrate 7 and, epitaxially grown on the n-type GaAs substrate 7 in the following order, an n-type GaAs buffer layer 6, an n-type $Al_{0.25}Ga_{0.75}As/Al_{0.85}Ga_{0.15}As$ laminated reflection film 5, an n-type $Al_{0.5}Ga_{0.5}As$ lower cladding layer 4, a p-type $Al_{0.20}Ga_{0.80}As$ active layer 3, a p-type $Al_{0.5}Ga_{0.5}As$ upper cladding layer 2, and a p-type GaAs contact layer 1 is formed, and individual light emitting parts 10 (see FIG. 2) are properly formed by etching. A p-side electrode 8 is formed on the contact layer 1 by ohmic contact, and an n-side common electrode 9 is formed on the whole area of the underside of the n-type GaAs substrate 7 to form an LED array.

The epitaxial layers formed on the substrate 6 are grown on the substrate 6 by MOVPE (metal organic vapor phase epitaxy). In this case, the growth temperature was 700° C. (substrate temperature), and the growth pressure was 70 Torr. Trimethylgallium and trimethylaluminum were used as group III materials. Arsine was used as a group V material. Hydrogen selenide was used as an n-type dopant, and diethylzinc (dimethylzinc is also possible) was used as a p-type dopant.

More specifically, the laminated reflection film 5 is formed of layer pairs. Each of the layer pairs is a multilayered film which is of n type and is formed of two AlGaAs layers different from each other in aluminum composition ratio, i.e., an $Al_{X1}Ga_{1-X1}As$ layer and an $Al_{X2}Ga_{1-X2}As$ layer where X1 and X2 each represent Al composition ratio, wherein hetero junction has been formed between the $Al_{X1}Ga_{1-X1}As$ layer. In this case, in the $Al_{X1}Ga_{1-X1}As$ layer and the $Al_{X2}Ga_{1-X2}As$ layer, the aluminum composition ratio is $X1<X2$ and the refractive index is $n1>n2$ where n1 represents the refractive index of the $Al_{X1}Ga_{1-X1}As$ layer and n2 represents the refractive index of the $Al_{X2}Ga_{1-X2}As$ layer. Further, in each layer pair, the aluminum composition ratios X1 and X2 satisfy $X1 \geqq X$ and $X2 \geqq X$ where X represents aluminum composition ratio in AlGaAs constituting the active layer. Further, the $Al_{X1}Ga_{1-X1}As$ layer satisfies $Eg_{X1} \geqq E\lambda$ wherein $Eg_{X1}$ represents the band gap energy of the $Al_{X1}Ga_{1-X1}As$ layer and $E\lambda$ represents emission wavelength energy.

In this case, the laminated reflection film 5 is formed by alternately stacking $Al_{0.25}Ga_{0.75}As$ layers (X1 =0.25) and $Al_{0.85}Ga_{0.15}As$ layers (X2=0.85) to form 12 pairs of $Al_{0.25}Ga_{0.75}As$ layer/$Al_{0.85}Ga_{0.15}As$ layer.

A printer with an emission part density of not less than 240 dpi can be easily realized using the above LED array. In this case, an LED array with an emission part density of 600 dpi was formed. Further, the size of a light emitting region in each LED constituting the light emitting parts was 50×50 $\mu$m or less. The electrode contact layer 1 was formed in a size of 10×50 $\mu$m or less at the center of the light emitting region (50×50 $\mu$m or less) in the light emitting part 10.

In the LED array with 600 dpi, when the laminated reflection film was formed of 12 pairs of GaAs layer/$Al_{0.85}Ga_{0.15}As$ layer, the total output at 5 mA was 100 $\mu$W, whereas, when laminated reflection film was formed of 12 pairs of $Al_{0.25}Ga_{0.75}As$ layer/$Al_{0.85}Ga_{0.15}As$ layer according to one preferred embodiment of the invention, the total output at 5 mA was 120 $\mu$W, indicating that an about 20% improvement in output could be realized over the prior art.

Figure 2:
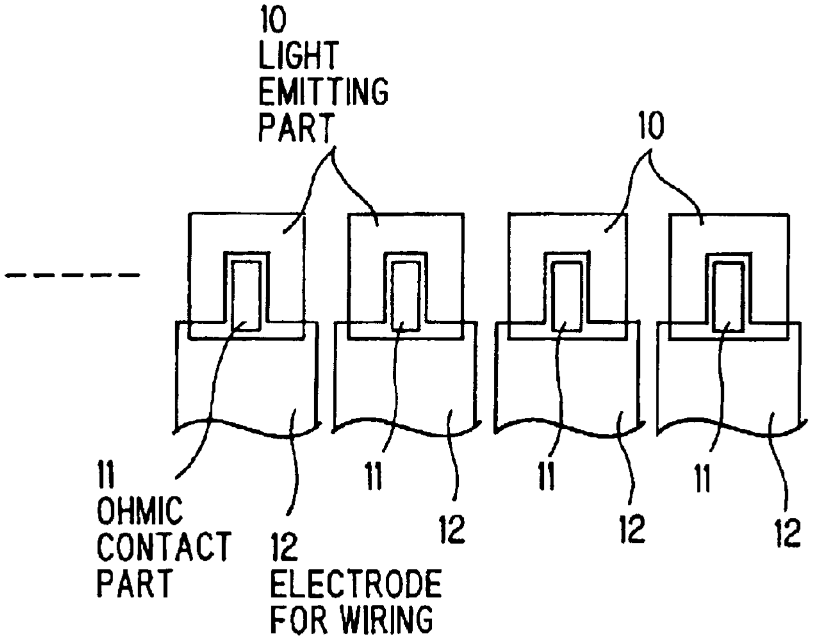
FIG. 2 is a diagram showing one embodiment of connection of electrodes for wiring to the light emitting device shown in FIG. 1.

FIG. 2 shows the arrangement of individual light emitting parts 10, shown in FIG. 1, constituting the LED array. In this embodiment, ohmic contact parts 11 serving as the p-side electrode 8 are formed on the electrode contact layers 1 provided at the center of the individual light emitting parts 10, electrodes 12 for wiring are formed on the contact layer 1 and the ohmic contact part 11, and anodes as the electrodes 12 for wiring are drawn on one side of the light emitting parts perpendicular to the direction of the row of each of the light emitting parts 10.

Figure 3:
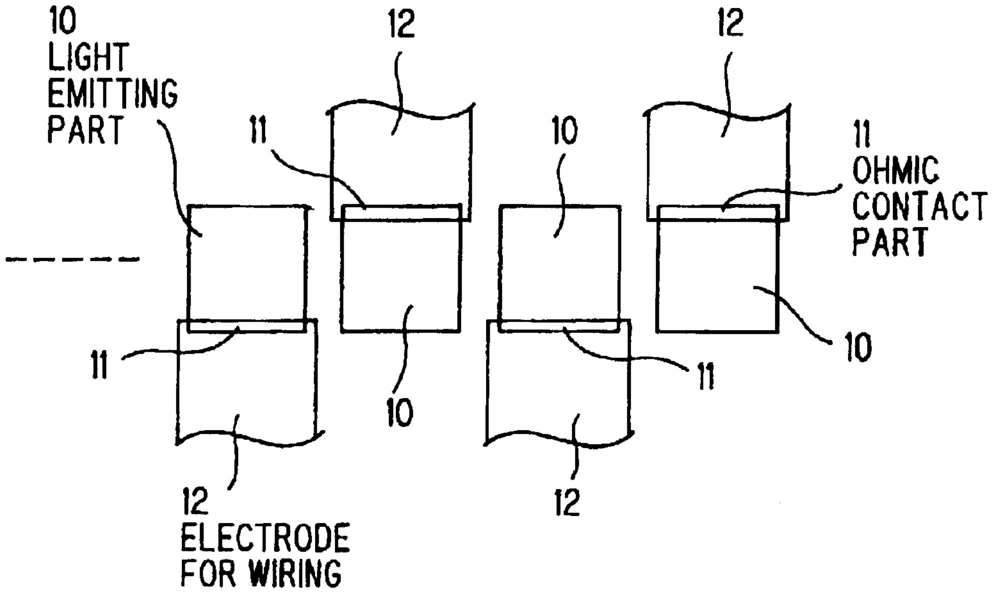
FIG. 3 is a diagram showing another embodiment of connection of electrodes for wiring to the light emitting device shown in FIG. 1.

FIG. 3 is an embodiment wherein ohmic contact parts 11 are formed at respective ends of the light emitting parts 10, and the anodes as the electrodes 12 for wiring are drawn alternately on one side of the light emitting part and on the other side of the light emitting part in a direction perpendicular to the direction of the row of each of the light emitting parts 10.

In the above preferred embodiment, the LED array was explained by taking a p-side-up LED array as an example. The invention can be also applied to LED arrays having an n-side-up structure provided on a p-type GaAs substrate.

Regarding dopants of the epitaxial layers, zinc (Zn), magnesium (Mg), and carbon (C) and a combination of two or more of them can also be used as the p-type dopant. Further, in addition to selenium (Se), tellurium (Te) and the like and a combination of two or more of Se, Te and the like can also be adopted as the n-type dopant.

The active layer may be formed of bulk-type $Al_XGa_{1-X}As$ (X: regulated so as to provide desired emission wavelength), or alternatively may be a multi-quantum well (MQW) type active layer.

The structure of the light emitting device and the production process of the light emitting device in the invention are not limited to array-type light emitting devices and can also be applied to light emitting devices other than array type.

As described above, in the LED array-type light emitting device according to the invention, the laminated reflection film formed of layer pairs each having a two-layer structure (aluminum composition ratio $X1<X2$, refractive index $n1>n2$) is constructed so that the two layers satisfy $X1 \geqq X$ and $X2 \geqq X$ where X represents aluminum composition ratio in $Al_XGa_{1-X}As$ constituting the active layer, and the $Al_{X1}Ga_{1-X1}As$ layer satisfies $Eg_{X1} \geqq E\lambda$ wherein $Eg_{X1}$ represents the band gap energy of the $Al_{X1}Ga_{1-X1}As$ layer and $E\lambda$ represents emission wavelength energy. By virtue of this construction, the forward voltage at the band offset point is lower than that of the laminated reflection film, in which GaAs has been adopted in one of the layers constituting the layer pair in the laminated reflection film. Further, the emission wavelength is less likely to be absorbed in the layers constituting the laminated reflection film.

Thus, a high output-type light emitting device of an LED array can be realized which, while utilizing the advantage of improved light takeout efficiency realized by providing a Bragg-type laminated reflection film, can suppress an increase in resistance of the device attributable to the provision of the laminated reflection film and, in its turn, an increase in forward voltage, and can realize high emission efficiency on the whole and is suitable as a light source for printers.

The invention has been described in detail with particular reference to preferred embodiments, but it will be understood that variations and modifications can be effected within the scope of the invention as set forth in the appended claims.

What is claimed is:

1. A monolithic array-type light emitting device comprising a plurality of light emitting parts in one device, wherein:

each of said light emitting parts comprises a light emitting diode having a laminate structure comprising an n-type GaAs substrate and, epitaxially grown on the n-type GaAs substrate in the following order, an n-type GaAs buffer layer, an n-type laminated reflection film formed of layer pairs each comprising AlGaAs layers different from each other in Al (aluminum) composition ratio, an n-type AlGaAs lower cladding layer, a p-type or undoped AlGaAs active layer, a p-type AlGaAs upper cladding layer, and a p-type GaAs contact layer; and each of said layer pairs constituting the laminated reflection film is a multilayered film of an $Al_{X1}Ga_{1-X1}As$ layer and an $Al_{X2}Ga_{1-X2}As$ layer where X1 and X2 satisfy 0<X1<1 and 0<X2<1, wherein hereto junction has been formed between the $Al_{X1}Ga_{1-X1}As$ layer and the $Al_{X2}Ga_{1-X2}As$ layer, wherein the Al composition ratio is X1<X2 and the refractive index is n1>n2 where n1 represents the refractive index of the $Al_{X1}Ga_{1-X1}As$ layer and n2 represents the refractive index of the $Al_{X2}Ga_{1-X2}As$ layer, wherein the $Al_{X1}Ga_{1-X1}As$ layer and the $Al_{X2}Ga_{1-X2}As$ layer satisfy $X1 \geqq X$ and $X2 \geqq X$ where X1 and X2 are as defined above and X represents Al composition ratio in $Al_XGa_{1-X}as$ constituting the active layer, and wherein the $Al_{X1}Ga_{1-X1}As$ layer satisfies $Eg_{X1} \geqq E\lambda$ wherein $Eg_{X1}$ represents the band gap energy of the $Al_{X1}Ga_{1-X1}As$ layer and $E\lambda$ represents emission wavelength energy.

2. The light emitting device according to claim 1, wherein the density of the light emitting parts is not less than 240 dpi.

3. The light emitting device according to claim 2, wherein the size of a light emitting region in each LED constituting the light emitting parts is 50×50 μm or less.

4. The light emitting device according to claim 3, wherein an electrode contact layer having a size of not more than 10×50 μm is provided on each of the light emitting regions, an ohmic contact part is provided on a part of the top of each of the contact layers, and anodes for respective wirings are drawn respectively from the ohmic contact parts.

5. The light emitting device according to claim 4, wherein the anodes for wirings provided in the p-type contact layer are arrayed in a given direction on one side of the light emitting parts perpendicular to the direction of the row of each of the light emitting parts, or alternatively are provided alternately on one side of the light emitting part and on the other side of the light emitting part in a direction perpendicular to the direction of the row of each of the light emitting parts.

6. The light emitting device according to claim 3, wherein the anodes for wirings provided in the p-type contact layer are arrayed in a given direction on one side of the light emitting parts perpendicular to the direction of the row of each of the light emitting parts, or alternatively are provided alternately on one side of the light emitting part and on the other side of the light emitting part in a direction perpendicular to the direction of the row of each of the light emitting parts.

7. The light emitting device according to claim 2, wherein an electrode contact layer having a size of not more than 10×50 μm is provided on each of the light emitting regions, an ohmic contact part is provided on a part of the top of each of the contact layers, and anodes for respective wirings are drawn respectively from the ohmic contact parts.

8. The light emitting device according to claim 7, wherein the anodes for wirings provided in the p-type contact layer are arrayed in a given direction on one side of the light emitting parts perpendicular to the direction of the row of each of the light emitting parts, or alternatively are provided alternately on one side of the light emitting part and on the other side of the light emitting part in a direction perpendicular to the direction of the row of each of the light emitting parts.

9. The light emitting device according to claim 2, wherein the anodes for wirings provided in the p-type contact layer are arrayed in a given direction on one side of the light emitting parts perpendicular to the direction of the row of each of the light emitting parts, or alternatively are provided alternately on one side of the light emitting part and on the other side of the light emitting part in a direction perpendicular to the direction of the row of each of the light emitting parts.

10. The light emitting device according to claim 1, wherein the size of a light emitting region in each LED constituting the light emitting parts is 50×50 μm or less.

11. The light emitting device according to claim 10, wherein an electrode contact layer having a size of not more than 10×50 μm is provided on each of the light emitting regions, an ohmic contact part is provided on a part of the top of each of the contact layers, and anodes for respective wirings are drawn respectively from the ohmic contact parts.

12. The light emitting device according to claim 11, wherein the anodes for wirings provided in the p-type contact layer are arrayed in a given direction on one side of the light emitting parts perpendicular to the direction of the row of each of the light emitting parts, or alternatively are provided alternately on one side of the light emitting part and on the other side of the light emitting part in a direction perpendicular to the direction of the row of each of the light emitting parts.

13. The light emitting device according to claim 10, wherein the anodes for wirings provided in the p-type contact layer are arrayed in a given direction on one side of the light emitting parts perpendicular to the direction of the row of each of the light emitting parts, or alternatively are provided alternately on one side of the light emitting part and on the other side of the light emitting part in a direction perpendicular to the direction of the row of each of the light emitting parts.

14. The light emitting device according to claim 1, wherein an electrode contact layer having a size of not more than 10×50 μm is provided on each of the light emitting regions, an ohmic contact part is provided on a part of the top of each of the contact layers, and anodes for respective wirings are drawn respectively from the ohmic contact parts.

15. The light emitting device according to claim 14, wherein the anodes for wirings provided in the p-type contact layer are arrayed in a given direction on one side of the light emitting parts perpendicular to the direction of the row of each of the light emitting parts, or alternatively are provided alternately on one side of the light emitting part and on the other side of the light emitting part in a direction perpendicular to the direction of the row of each of the light emitting parts.

16. The light emitting device according to claim 1, wherein the anodes for wirings provided in the p-type contact layer are arrayed in a given direction on one side of the light emitting parts perpendicular to the direction of the row of each of the light emitting parts, or alternatively are provided alternately on one side of the light emitting part and on the other side of the light emitting part in a direction perpendicular to the direction of the row of each of the light emitting parts.

* * * * *